(12) United States Patent
Okumura et al.

(10) Patent No.: US 6,391,747 B1
(45) Date of Patent: May 21, 2002

(54) METHOD FOR FORMING POLYCRYSTALLINE SILICON FILM

(75) Inventors: Hiroshi Okumura; Kenji Sera, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/498,619

(22) Filed: Feb. 7, 2000

(30) Foreign Application Priority Data

Feb. 9, 1999 (JP) .......................................... 11-030996

(51) Int. Cl.⁷ .............................................. H01L 21/20
(52) U.S. Cl. ..................... 438/478; 438/486; 438/487
(58) Field of Search .................. 438/478, 159–162, 438/166, 486–488

(56) References Cited

U.S. PATENT DOCUMENTS 5,639,698 A * 6/1997 Yamazaki et al. .......... 438/159
5,643,826 A * 7/1997 Ohtani et al. ............... 438/462

FOREIGN PATENT DOCUMENTS

| JP | 5-21339 | 1/1993 |
|---|---|---|
| JP | 6-267988 | 9/1994 |
| JP | 7-162004 | 6/1995 |
| JP | 307286 | 11/1995 |
| JP | 8-69967 | 3/1996 |
| JP | 2776276 | 5/1998 |
| JP | 10-233363 | 9/1998 |
| JP | 11-67663 | 3/1999 |

OTHER PUBLICATIONS

Constanta Palog,PbTIO3 film via sol–gel, Ins. of Phy. Chemistry Pplaiul Independentel 202, Bucharest 77208, Ramani. 0–7803–3647–4/95/$4.00 1995 IEEE.*

* cited by examiner

Primary Examiner—David Nelms
Assistant Examiner—Dung A Le
(74) Attorney, Agent, or Firm—Young & Thompson

(57) ABSTRACT

In a method for forming a polycrystalline silicon (poly-Si) thin film on an inexpensive glass substrate, a cap film doped with a catalyst element is provided on an amorphous silicon (a-Si) film formed on the substrate. The a-Si film is transformed into the poly-Si film by irradiating an excimer laser beam on the a-Si film through the cap film. Thereafter, the cap film is removed from the poly-Si film together with the catalyst element precipitated therein.

19 Claims, 4 Drawing Sheets

METHOD FOR FORMING POLYCRYSTALLINE SILICON FILM

BACKGROUND OF THE INVENTION

1. Field of the Invention

The present invention relates to a method for forming a semiconductor-thin-film, particularly to a method for forming a polycrystalline silicon (poly-Si) film for a thin-film transistor (TFT) used for a liquid-crystal display or an IC.

2. Description of the Prior Art

It has been recently possible to provide a liquid-crystal display having a driving circuit using a poly-Si TFT formed on an inexpensive glass substrate. In view of low process temperature and a high throughput, an excimer laser crystallization method is known for forming such a poly-Si thin film, wherein an amorphous-silicon (a-Si) thin film formed on the glass substrate is crystallized by irradiating an excimer laser beam thereon.

The excimer laser crystallizing method has a problem that uniformity in electrical characteristics cannot be obtained. To avoid the problem, a so-called cap annealing method is disclosed in the Japanese Patent registered No. 2776276 issued on May 1, 1998, wherein an $SiO_2$ thin film is deposited on an a-Si thin film as a cap film prior to performing laser crystallization process for flattening a surface of a poly-Si thin film.

However, the cap annealing method has another problem that a crystal-grain size of the poly-Si film is limited because the interface between the cap film and the a-Si thin film serves as a nucleation site for crystallization. Therefore, a field-effect mobility of a poly-Si TFT remains at approx. 100 $cm^2$/Vs. Although a liquid-crystal display can be realized by using such low mobility, it is impossible to realize a high-integration circuit such as a DRAM to be driven at a high frequency.

Moreover, as disclosed in the Japanese Patent Laid-Open Nos. 267988/1994 and 69967/1996, it is also known to utilize a catalyst element such as nickel for accelerating crystallization of an a-Si thin film.

However, when utilizing a catalyst element, it remains in a poly-Si thin film. Therefore, a special process such as heat treatment is necessary for removing the catalyst element as disclosed in the Japanese Patent Laid-Open No. 233363/1998.

SUMMARY OF THE INVENTION

It is, therefor, an object of the present invention to solve the above problems and provide a new method for forming a poly-Si thin film having a large crystal grain size and a uniform electrical characteristics without increasing the number of steps.

A semiconductor-thin-film forming method according to the present invention enlarges a grain size of an obtained poly-Si thin film by adding a catalyst element for accelerating crystallization of an a-Si (or recrystallization of a poly-Si having a small crystal grain size) into a cap film in a cap annealing method for obtaining the poly-Si thin film by using an excimer laser crystallizing method and thereby irradiating a laser beam on the a-Si thin film through the cap film which is made of a transparent insulating film.

By using the cap film, the catalyst element does not deeply doped into the a-Si film. The catalyst element shallowly doped into the a-Si film precipitates on the interface between the poly-Si film and the cap film after laser annealing. By removing the cap film, the precipitated catalyst element is also removed together with the cap film. Accordingly, a new catalyst-element-removing step is unnecessary and thus, the amount of the catalyst element in the poly-Si film is greatly reduced.

To achieve the above object, the present invention basically has the following aspects.

That is, the first aspect of a semiconductor-thin-film forming method of the present invention is characterized by successively forming a non-single-crystal thin-film semiconductor, i.e., amorphous semiconductor film or polycrystalline semiconductor film having a fine crystal grain size, and a cap film containing a catalyst element in order on an insulating substrate. Then a high-output laser beam such as an excimer laser beam is irradiated on the amorphous film through the cap film to transform the amorphous film into polycrystalline film. After that, the cap film is removed.

The second aspect of the present invention is characterized by doping a catalyst element into the cap film for accelerating crystallization of a non-single-crystal thin-film semiconductor film prior to irradiating the excimer layer beam on the amorphous film through the cap film.

The third aspect of the present invention is characterized by forming the cap film by using a sputtering method or a hot-wire CVD method.

The fourth aspect of the present invention is characterized by using the cap film having a thickness of at least 10 nm.

The fifth aspect of the present invention is characterized by removing the cap film by using a dry etching method using a gas containing halogen.

The sixth aspect of the present invention is characterized by including an RCA cleaning method in removing process of the cap film.

The seventh aspect of the present invention is that the above mentioned catalyst element is selected from a group consisting of Ni, Pt, Pd, Co, Fe, Cu, Au, Ag, Cr, and mixture thereof as the catalyst element or elements.

The eighth aspect of the present invention is characterized by using a silicon oxide film as the cap film.

DETAILED DESCRIPTION OF THE PREFERRED EMBODIMENTS

Figure 1A:
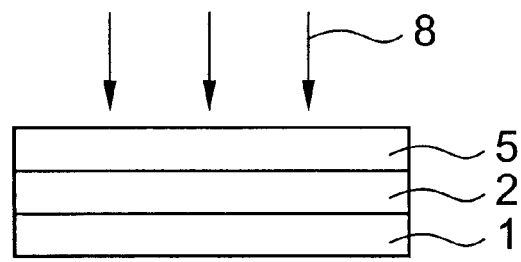
FIG. 1A to FIG. 1C are schematic forming-step diagrams for explaining a method for forming a semiconductor thin film according to the present invention and also explain the second embodiment thereof.

Referring to FIG. 1A, an a-Si thin film 2 is formed on a glass substrate 1. Then, a cap film 5 of $SiO_2$ is formed on the a-Si thin film 2. A catalyst element such as Ni, Pt, Pd, Co, Fe, Cu, Au, Ag, or Cr for accelerating crystallization of the a-Si film is doped into the cap film 5. The a-Si thin film 2 is laser-crystallized from the upper side of the $SiO_2$ thin film 5 by irradiating a high-output laser beam 8.

Figure 1B:
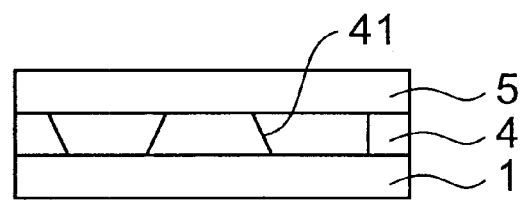

Crystallization of a silicon is accelerated by the above described catalyst element doped into the cap film 5 and the a-Si thin film 2 is transformed into a poly-Si thin film 4 having a large grain size as shown in FIG. 1B. A reference numeral 41 indicates crystal grain boundary of the poly-Si film 4. Moreover, in this case, the surface of the poly-Si thin film 4 is flattened owing to the presence of the cap film 5.

Figure 1C:
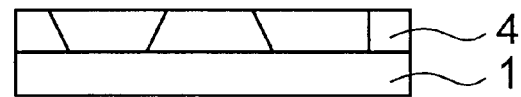

Then, as shown in FIG. 1C, the cap film 5 is removed from the poly-Si film 4 by using a dry etching method or an RCA cleaning method. In this case, the doped catalyst element is simultaneously removed together with the cap film 5.

Therefore, it is possible to form a poly-Si thin film superior in flatness and having a large grain size without increasing the number of manufacturing steps. As a result, it is possible to realize a poly-Si thin-film transistor device having a high electron mobility with a high uniformity in an electric characteristics.

As for the cap film 5, it is made of an insulative material and it should be a transparent to the laser beam.

Embodiments of a semiconductor-thin-film forming method of the present invention are described below in detail by referring to the accompanying drawings.

First Embodiment

The first embodiment of the present invention is described below by referring to FIG. 2.

An a-Si thin film 2 is formed on a glass substrate 1 by using a low-pressure chemical vapor deposition (LPCVD) method which can form the thin film so as not include a gas therein. The thickness of the a-Si thin film 2 is 50 nm. Although it is not illustrated in the drawings, it is preferable to form an $SiO_2$ film on the substrate 1 as a cover film by using a plasma-enhanced chemical vapor deposition (PECVD) method prior to forming the a-Si film 2. The thickness of the $SiO_2$ cover film is 200 nm. As for the film-forming methods for the a-Si film 2, the PECVD method or a sputtering method can be used other than the above mentioned LPCVD method containing no gas.

Then, an $SiO_2$ film serving as a cap film 5 is formed by using the LPCVD method. At this stage, no catalyst element is contained in the cap film 5. The thickness of the cap film 5 is set to a necessary minimum value of 10 nm at which the flattening effect under laser annealing is produced. In view of a throughput, the thickness of the cap film 5 is selected to be less than 300 nm.

Figure 2A:
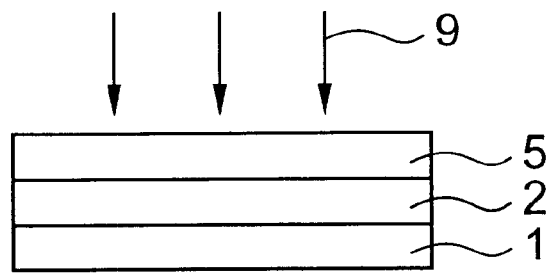
FIG. 2A to FIG. 2D are schematic forming-step diagrams for explaining the first embodiment of the present invention.

Then, as shown in FIG. 2A, the cap film 5 is doped with nickel serving as a catalyst element by implanting Ni-ions 9 into the cap film 5 by using an ion implantation method. An acceleration voltage for the ion implantation is set to 10 keV. In this case, the concentration of nickel ions contained in the vicinity of the interface between the cap film 5 and the a-Si thin film 2 shows $8 \times 10^{17}$ $cm^{-3}$. An ion concentration in the cap film 5 can be controlled by selecting either one of a thickness of the cap film 5, acceleration voltage, or implantation quantity. Moreover, a resist film may be provided on the cap film 5 in order to control the ion concentration. A favorable concentration of the catalyst element in the cap film 5 is ranges from $1 \times 10^{16}$ $cm^{-3}$ to $1 \times 10^{20}$ $cm^{-3}$.

Figure 2B:
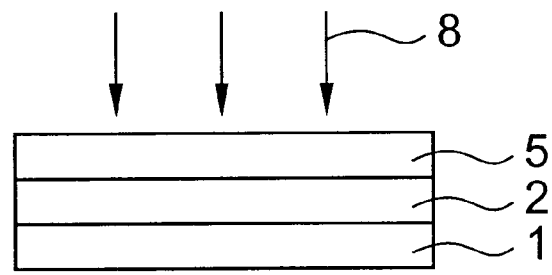

Then, as shown in FIG. 2B, an XeCl laser beam 8 is irradiated on the cap film 5 in a manner of scanning operation from its upper side. The irradiation energy is set to 450 mJ/cm2 and the beam overlap rate is set to 90%. In the case of melting and re-crystallization of Si by the laser irradiation, the vicinity of an interface of the a-Si film 2 and the cap film 5 has a high stress and therefore, impurities discharged from a silicon liquid phase are easily coagulated. Particularly, the coagulation becomes remarkable with a combination of $SiO_2$ and either one of Ni, Fe and Cr.

Figure 2C:
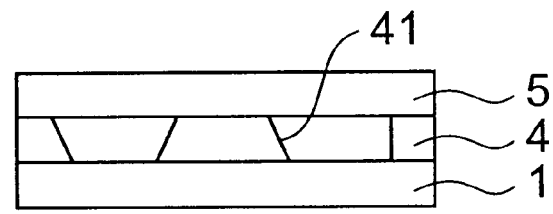

The mean grain size of the poly-Si thin film 4 formed through the above step is approx. 430 nm and columnar grains completely grown in the film-thickness direction is formed as shown in FIG. 2C. Moreover, as the result of evaluating the poly-Si thin film 4 under the above condition by an atomic force microscope (AFM), it is found that the poly-Si film 4 has a surface roughness of 6.8 nm.

Figure 4A:
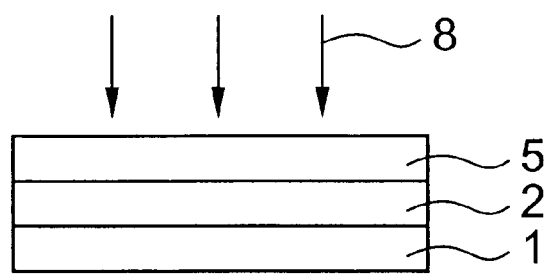
FIG. 4A and FIG. 4B are schematic forming-step diagrams showing a conventional forming method as a comparative example.
Figure 4B:

On the contrary, in the conventional cap annealing method as shown in FIG. 4A and FIG. 4b, a two-layered fine poly-Si tissue layer 6 having a mean grain size of 50 nm is obtained. Although the flatness of the poly-Si layer 6 is similar to the first embodiment of the present invention, grain size thereof is very small.

Figure 2D:

Then, as shown in FIG. 2D, the cap film 5 is removed by successively performing a buffered hydrofluoric-acid cleaning, an RCA cleaning ($H_2O_2$/HCl), and a dilute-hydrofluoric-acid cleaning in order. In this stage, the catalyst element is simultaneously removed together with the cap film 5. As the result of fabricating a thin-film transistor by using the poly-Si film thus formed, a high-mobility of 360 $cm^2$/Vs at a field-effect mobility and high-uniformity in the electrical characteristics with a dispersion of 5% or less are realized.

When performing only the buffered hydrofluoric-acid cleaning without using the RCA cleaning method to remove the cap film, extreme increase of a leak current due to influence of an impurity element is observed in TFT characteristics. Therefore, the RCA cleaning is necessary to completely remove a catalyst element precipitated on the interface between the poly-Si film and the cap film. However, to remove the catalyst element, heat treatment is unnecessary which extremely lowers a throughput. In the present invention, the above mentioned extreme leak current is not observed. To this end, it is estimated that the density of the catalyst element in the poly-Si film is less than $1 \times 10^{14}$ $cm^{-3}$.

Second Embodiment

The second embodiment of the present invention is described below by referring to FIGS. 1A to 1C again. An SiN film with a thickness of 100 nm is formed on a glass substrate 1 as a cover film (not illustrated) by using a PECVD method. An a-Si film 2 of 75 nm thickness is formed on the SiN film by using a LPCVD. Then, an $SiO_2$ film of 110 nm thickness serving as a cap film 5 is formed on the a-Si film 2 by using an RF sputtering method in a stainless steel chamber. In this case, metal elements constituting a stainless steel sputtering chamber such as Fe and Cr are doped into the $SiO_2$ film 5. For example, the concentration of Fe and Cr are $6 \times 10^{17}$ $cm^{-3}$ and $9 \times 10^{16}$ $cm^{-3}$, respectively.

Then, as shown in FIG. 1A, a KrF laser beam 8 is irradiated on the a-Si film 2 through the cap film 5 containing catalyst elements Fe and Cr to transform the a-Si film 2 into a poly-Si thin film 4 (FIG. 1B). In this stage, the irradiation intensity is set to 480 mJ/$cm^2$ and the beam overlap rate is set to 95%. The poly-Si thin film 4 has a mean crystal-grain size of 390 nm and a surface irregularity of 5.4 nm.

Then, as shown in FIG. 1C, the cap film 5 is removed from the poly-Si film 4 by using a dry etching method. As for the conditions of the dry etching method, a $CF_4$-gas flow rate is set to 40 sccm, an $O_2$-gas flow rate is set to 10 sccm, a pressure is set to 6 Pa, and a discharge output is set to 500 W. As the result of fabricating a thin film transistor by using a poly-Si thin film formed in accordance with the above method, high-mobility of 310 $cm^2$/Vs at a field-effect mobility and high-uniformity in electrical characteristics with a dispersion of 5% or less are realized. Because halogen is contained in a dry-etching gas, a catalyst-element-removing capability is high. Moreover, even the catalyst elements nearby the interface of the cap film 5 and the poly-Si film are removed simultaneously with the removal of the cap film.

Third Embodiment

The third embodiment of the present invention is described below by referring to FIGS. 3A to 3D.

Figure 3A:
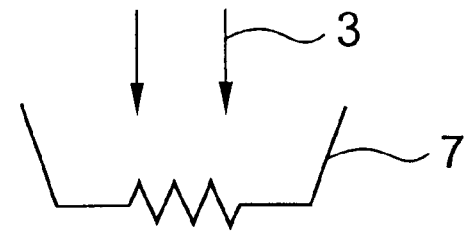
FIG. 3A to FIG. 3D are schematic forming-step diagrams for explaining the third embodiment of the present invention.
Figure 3B:
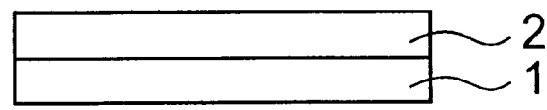

As shown in FIG. 3A, an $SiO_2$ film of 100 nm thickness (not illustrated) is formed on a glass substrate 1 as a cover film by using a PECVD method. Thereafter, an a-Si film 2 of 50 nm thickness is formed on the $SiO_2$ film. Then, the a-Si film 2 is dehydrogenated by annealing the film 2 at 400 for 30° C. for 30 min. Then, a cap film 5 of $SiO_2$ is formed on the a-Si film 2 up to a thickness of 50 nm by using a hot wire CVD method (FIG. 3B). A hot wire 7 uses a Pt wire. The wire temperature is 1100° C., the distance between the substrate and the wire is 20 mm, and the substrate temperature is 350° C. As for the typical example of film-forming gases 3, a flow rate of silane gas is 20 sccm, a flow rate of $N_2O$ gas is 400 sccm, and a flow rate of He gas is 100 sccm. In this case, Pt is doped into the $SiO_2$ film 5 as an impurity of a catalyst element and its concentration is $1 \times 10^{18}$ cm$^{-3}$.

Then, as shown in FIG. 3B, the XeCl laser beam 8 is irradiated on the a-Si film 2 through the cap film 5 in a manner of scanning operation. The laser irradiation energy is set to 330 mJ/cm$^2$ and the beam overlap rate is set to 90%.

Figure 3C:
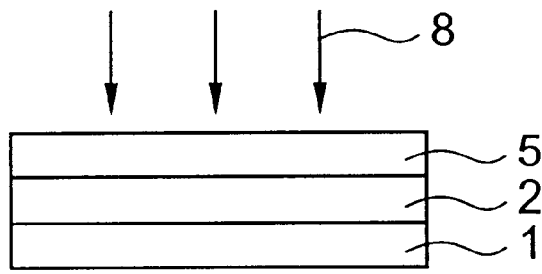

As shown in FIG. 3C, the a-Si thin film 2 is transformed into a poly-Si thin film 4. The resulted poly-Si film 4 has a mean crystal-grain size of 680 nm and a surface roughness of 6.1 nm.

Figure 3D:
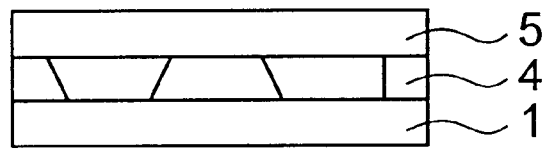

Then, as shown in FIG. 3D, the cap film 5 is removed by using a dry etching method under the same conditions as the case of the second embodiment.

As described above, a semiconductor-thin-film forming method of the present invention makes it possible to form a poly-Si thin film superior in flatness and having a large grain size without increasing the number of steps and resultantly, realize a poly-Si thin-film transistor device having a high uniformity and a high mobility in a TFT characteristics.

According to the present invention, one or some of such elements as Ni, Pt, Pd, Co, Fe, Cu, Au, Ag, and Cr can be used as a catalyst element or catalyst elements. When the cap film is an $SiO_2$ film, it is preferable to select Ni, Fe, and/or Cr as the catalyst elements.

What is claimed is:

1. A semiconductor-thin-film forming method comprising: a step of forming a non-single-crystal semiconductor film on a substrate having an insulation surface; a step of forming a cap film of a transparent insulating material on said semiconductor film, said cap film containing a catalyst element for accelerating crystallization of said semiconductor film; a step of irradiating a laser beam on said semiconductor film through said cap film; and a step of removing said cap film after said step of irradiating said laser beam.

2. The semiconductor-thin-film forming method according to claim 1, wherein said catalyst element is added to said cap film after said step of forming said cap film.

3. The semiconductor-thin-film forming method according to claim 1, wherein said catalyst element is added to said cap film during said step of forming said cap film.

4. The semiconductor-thin-film forming method according to claim 2, wherein said catalyst element is added to said cap film by using an ion implantation.

5. The semiconductor-thin-film forming method according to claim 3, wherein said catalyst element is added to said cap film simultaneously when said cap film is formed by using a sputtering method.

6. The semiconductor-thin-film forming method according to claim 3, wherein said catalyst element is added to said cap film by using a hot wire CVD method.

7. The semiconductor-thin-film forming method according to claim 1, wherein said cap film has a thickness of at least 10 nm.

8. The semiconductor-thin-film forming method according to claim 1, wherein said cap film is removed by using a dry etching method provided with an etching gas containing halogen.

9. The semiconductor-thin-film forming method according to claim 1, wherein said step of removing said cap film includes a RCA cleaning.

10. The semiconductor-thin-film forming method according to claim 1, said catalyst element is selected from a group consisting of Ni, Pt, Pd, Co, Fe, Cu, Au, Ag, Cr, and mixture thereof.

11. The semiconductor-thin-film forming method according to claim 1, wherein said cap film is a silicon oxide film.

12. The semiconductor-thin-film forming method according to claim 1, wherein said laser beam is an excimer laser beam.

13. A method of making a semiconductor thin film, comprising the steps of:

forming a cap film that is at least 10 nm thick on a non-single-crystal semiconductor film that is on a substrate having an insulation surface, the cap film being a transparent electrical insulator and containing a catalyst that accelerates crystallization of the semiconductor film;

irradiating a laser beam through the cap film onto the semiconductor film to crystallize the semiconductor film; and removing the cap film after the irradiating step.

14. The method of claim 13, wherein the cap film is silicon oxide to which the catalyst is added after the cap film is formed.

15. The method of claim 13, wherein the cap film is silicon oxide to which the catalyst is added while forming the cap film.

16. A method of making a semiconductor thin film, comprising the steps of:

forming a silicon oxide cap film on a non-single-crystal semiconductor film that is on a substrate having an insulation surface, the silicon oxide cap film containing a catalyst that accelerates crystallization of the semiconductor film;

irradiating a laser beam through the silicon oxide cap film onto the semiconductor film to crystallize the semiconductor film; and removing the silicon oxide cap film after the irradiating step.

17. The method of claim 16, wherein the catalyst is added after the cap film is formed.

18. The method of claim 16, wherein the catalyst is added while forming the cap film.

19. The method of claim 16, wherein the silicon oxide cap film is at least 10 nm thick.

* * * * *